US009553078B2

(12) United States Patent
Eichenberg et al.

(10) Patent No.: US 9,553,078 B2
(45) Date of Patent: Jan. 24, 2017

(54) LIGHT-EMITTING DIODE MODULE AND MOTOR VEHICLE HEADLIGHT

(71) Applicant: OSRAM Opto Semiconductors GmbH, Regensburg (DE)

(72) Inventors: Boris Eichenberg, Schierling (DE); Jürgen Holz, Wenzenbach (DE)

(73) Assignee: OSRAM Opto Semiconductors GmbH (DE)

( * ) Notice: Subject to any disclaimer, the term of this patent is extended or adjusted under 35 U.S.C. 154(b) by 164 days.

(21) Appl. No.: 14/411,425

(22) PCT Filed: May 31, 2013

(86) PCT No.: PCT/EP2013/061265
§ 371 (c)(1),
(2) Date: Dec. 26, 2014

(87) PCT Pub. No.: WO2014/001019
PCT Pub. Date: Jan. 3, 2014

(65) Prior Publication Data
US 2015/0228630 A1 Aug. 13, 2015

(30) Foreign Application Priority Data
Jun. 28, 2012 (DE) .................. 10 2012 105 677

(51) Int. Cl.
*F21V 9/16* (2006.01)
*H01L 33/50* (2010.01)
(Continued)

(52) U.S. Cl.
CPC .......... *H01L 25/0753* (2013.01); *F21S 48/115* (2013.01); *H01L 33/486* (2013.01);
(Continued)

(58) Field of Classification Search
CPC ............... H01L 25/0753; H01L 2933/0091; H01L 33/486; H01L 33/505; H01L 33/54; H01L 33/56; H01L 33/60; H01L 33/62; F21S 48/115; F21Y 2101/00; F21Y 2115/00; F21Y 2115/10
See application file for complete search history.

(56) References Cited

U.S. PATENT DOCUMENTS 8,297,767 B2 * 10/2012 Tseng .................... F21K 9/54
362/2
8,492,185 B1 * 7/2013 D'Evelyn ......... H01L 21/02395
257/E21.121
(Continued)

FOREIGN PATENT DOCUMENTS

CN 101740599 6/2010
CN 102263098 11/2011
(Continued)

OTHER PUBLICATIONS

English translation of the Notice of Reasons for Rejection dated Sep. 8, 2015 of corresponding Japanese Application No. 2015-503901.
(Continued)

*Primary Examiner* — Peggy Neils
(74) *Attorney, Agent, or Firm* — DLA Piper LLP (US)

(57) ABSTRACT

A light-emitting diode module includes a carrier and a plurality of optoelectronic semiconductor chips mounted on a carrier top and configured to generate primary radiation. The semiconductor chips are arranged in part at a first distance and in part at a second, greater distance from one another. Between the adjacent semiconductor chips arranged at the first distance from one another there is located a radiation-transmissive first filling for optical coupling. Between the adjacent semiconductor chips arranged at the
(Continued)

second distance from one another there is located a radiation-opaque second filling for optical isolation.

13 Claims, 6 Drawing Sheets

(51) Int. Cl.
H01L 25/075 (2006.01)
H01L 33/48 (2010.01)
H01L 33/54 (2010.01)
F21S 8/10 (2006.01)
H01L 33/56 (2010.01)
H01L 33/60 (2010.01)
H01L 33/62 (2010.01)

(52) U.S. Cl.
CPC ............ *H01L 33/507* (2013.01); *H01L 33/54* (2013.01); *H01L 33/56* (2013.01); *H01L 33/60* (2013.01); *H01L 33/62* (2013.01); *H01L 33/505* (2013.01); *H01L 2924/0002* (2013.01); *H01L 2933/0091* (2013.01)

(56) References Cited

U.S. PATENT DOCUMENTS

| 2010/0127288 | A1 | 5/2010 | Kuo et al. |
| 2011/0050071 | A1 | 3/2011 | Chung et al. |
| 2011/0069256 | A1 | 3/2011 | Ohkubo |
| 2011/0193108 | A1 | 8/2011 | Wu et al. |
| 2011/0215349 | A1 | 9/2011 | An et al. |
| 2011/0278605 | A1 | 11/2011 | Agatani et al. |
| 2011/0309388 | A1 | 12/2011 | Ito et al. |
| 2012/0193662 | A1* | 8/2012 | Donofrio ............... H01L 33/60 257/98 |
| 2012/0235169 | A1* | 9/2012 | Seko ....................... H01L 33/60 257/88 |
| 2012/0257386 | A1* | 10/2012 | Harbers ................... F21K 9/56 362/235 |

FOREIGN PATENT DOCUMENTS

| DE | 199 45 470 | 4/2001 |
| DE | 10 2006 009 955 | 10/2006 |
| DE | 10 2007 011 123 | 9/2008 |
| DE | 10 2007 046 339 | 4/2009 |
| DE | 10 2008 011 153 | 5/2009 |
| DE | 10 2012 101 160 | 8/2013 |
| JP | 2005-109434 | 4/2005 |
| JP | 2007-207833 | 8/2007 |
| JP | 2008-235805 | 10/2008 |
| JP | 2009-231525 | 10/2009 |
| JP | 2010-130007 | 6/2010 |
| JP | 2010-157638 | 7/2010 |
| JP | 2012-59939 | 3/2012 |
| JP | 2012-89761 | 5/2012 |
| JP | 4926303 | 5/2012 |
| WO | 2013/011594 | 1/2013 |

OTHER PUBLICATIONS

English translation of a Notification of the First Office Action dated Sep. 20, 2016, of corresponding Chinese Patent Application No. 201380034654.X.

* cited by examiner

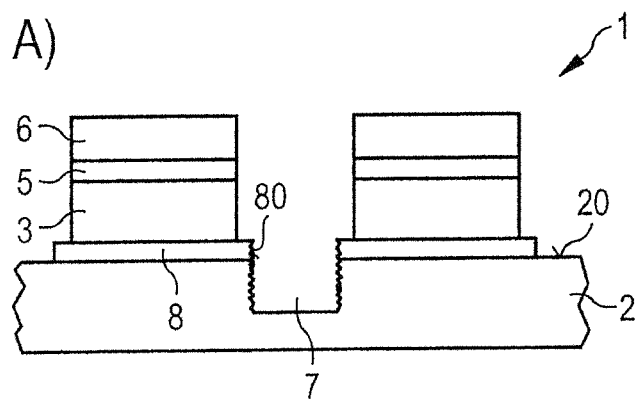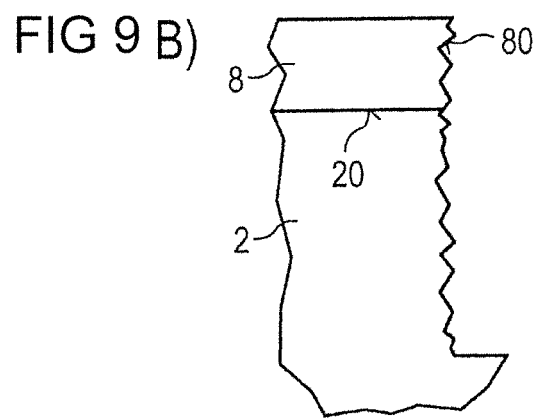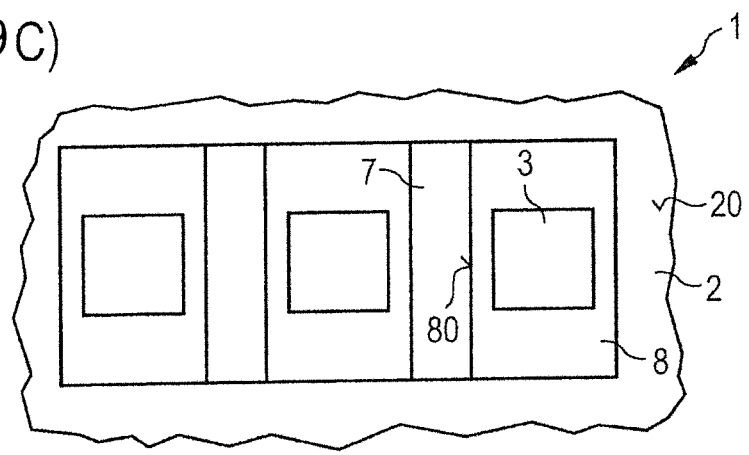

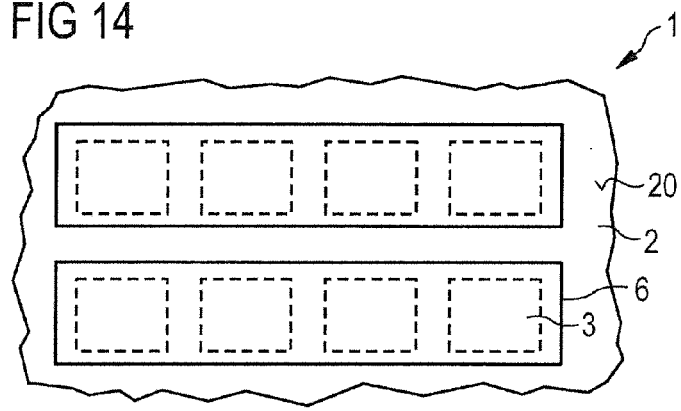
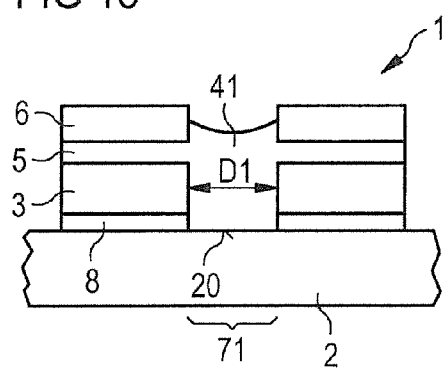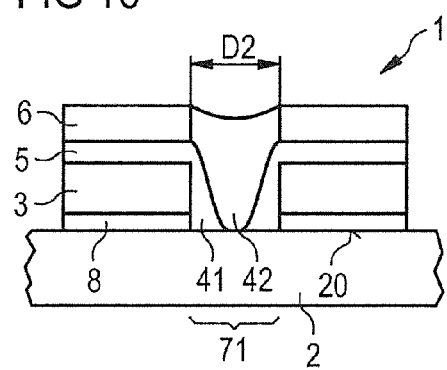
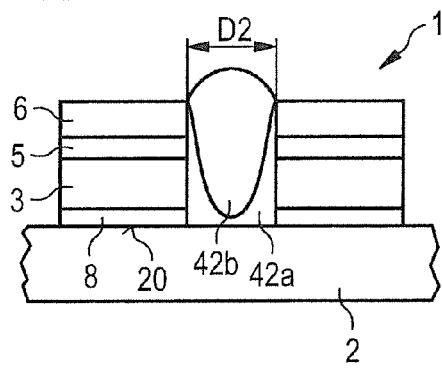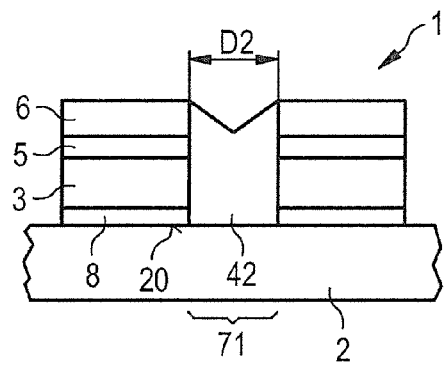

LIGHT-EMITTING DIODE MODULE AND MOTOR VEHICLE HEADLIGHT

TECHNICAL FIELD

This disclosure relates to a light-emitting diode module and a motor vehicle headlight with such a light-emitting diode module.

BACKGROUND

There is a need to provide a light-emitting diode module in which optical coupling or optical isolation may be purposefully adjusted between adjacent semiconductor chips.

SUMMARY

We provide a light-emitting diode module including a carrier with a carrier top, a plurality of optoelectronic semiconductor chips mounted on the carrier top and configured to generate primary radiation, a radiation-transmissive first filling, and a radiation-opaque second filling, wherein the semiconductor chips display in part a first distance and in part a second, larger distance from one another, the first filling is located between the adjacent semiconductor chips arranged at the first distance from one another for optical coupling of the adjacent semiconductor chips with one another, and the second filling is located between the adjacent semiconductor chips arranged at the second distance from one another for optical isolation of the adjacent semiconductor chips from one another.

We also provide a motor vehicle headlight including one or more light-emitting diode modules.

We further provide a light-emitting diode module including a carrier with a carrier top, a plurality of optoelectronic semiconductor chips mounted on the carrier top and configured to generate primary radiation, a radiation-transmissive first filling, and a radiation-opaque second filling, wherein the semiconductor chips display in part a first distance and in part a second, larger distance from one another, the first filling is located between the adjacent semiconductor chips arranged at the first distance from one another for optical coupling of the adjacent semiconductor chips with one another, the second filling is located between the adjacent semiconductor chips arranged at the second distance from one another for optical isolation of the adjacent semiconductor chips from one another, at least one trench is formed in the carrier, and the trench is formed at least or only between adjacent semiconductor chips arranged at the greater, second distance from one another.

BRIEF DESCRIPTION OF THE DRAWINGS

FIGS. 1 to 8, 9A-9C, 10 to 18 and 20 show schematic representations of examples of our light-emitting diode modules.

DETAILED DESCRIPTION

Figure 1:
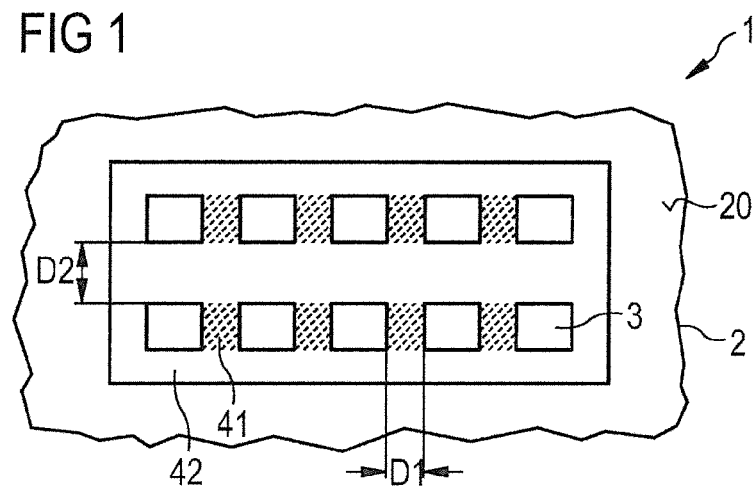

We provide a light-emitting diode module that may comprise a carrier with a carrier top. The carrier preferably includes electrical conductor tracks and electrical contact points for operation of the light-emitting diode module. The carrier is preferably the component which mechanically supports and mechanically stabilizes the light-emitting diode module. The carrier, for example, comprises a printed circuit board, a metal-core board or a ceramic substrate.

The light-emitting diode module may contain a plurality of optoelectronic semiconductor chips. The semiconductor chips generate primary radiation during operation of the light-emitting diode module. The primary radiation preferably comprises blue light or ultraviolet radiation, for example, in the spectral range of 400 nm to 480 nm, relative to a peak wavelength. The semiconductor chips are preferably light-emitting diode chips.

The semiconductor chips may be mounted indirectly or directly on the top of the carrier. The semiconductor chips are, for example, adhesively bonded to the carrier top or soldered to the carrier top. The semiconductor chips may be arranged in the manner of a matrix in a regular pattern on the carrier top.

The light-emitting diode module may comprise a radiation-transmissive first filling. Radiation-transmissive may mean that visible light and/or primary radiation can pass through the first filling without significant absorption losses and/or without significant scattering.

The light-emitting diode module may comprise a radiation-opaque second filling. Radiation-opaque means that the second filling has a transmittance for visible light and/or for the primary radiation of at most 10% or of at most 5% or of at most 1%, in particular in a direction parallel to the carrier top. The second filling may be reflective or absorbing, in particular in terms of the primary radiation. The second filling may be composed of a plurality of components, for example, of various casting compounds or of a casting compound and a premanufactured component.

The semiconductor chips may be arranged in part at a first distance from one another. Furthermore, the semiconductor chips may be arranged in part at a second distance from one another. The second distance is here greater than the first distance. In other words, there are at least two different distances between adjacent semiconductor chips, within the arrangement of the semiconductor chips on the carrier top. It is possible for precisely two different distances to arise between adjacent semiconductor chips in the arrangement.

The radiation-transmissive first filling may be mounted between the adjacent semiconductor chips arranged at a first distance from one another. The first filling is configured for optical coupling of these adjacent semiconductor chips. In other words, optical coupling between these semiconductor chips between which the first filling is located is preferably higher than in a state without the first filling. More radiation may then pass from one of these adjacent semiconductor chips to the other semiconductor chip than would be the case without the first filling.

The second filling may be located between the adjacent semiconductor chips arranged at a second distance from one another. The second filling is configured to isolate these adjacent semiconductor chips optically from one another. In other words, no or only a negligible proportion of the radiation generated during operation can pass from one of these adjacent semiconductor chips to the other adjacent semiconductor chips, in particular along a direct path.

The second filling may be located between the adjacent semiconductor chips arranged at a first distance from one another and the first filling is located between the adjacent semiconductor chips arranged at a second distance from one another.

The light-emitting diode module may comprise a carrier with a carrier top and a plurality of optoelectronic semiconductor chips, wherein the semiconductor chips are mounted on the carrier top and are configured to generate primary radiation. The semiconductor chips are arranged in part at a first distance and in part at a second, greater distance from one another. Between the adjacent semiconductor chips arranged at the first distance from one another there is located a radiation-transmissive first filling for optical coupling of these semiconductor chips. Between the adjacent semiconductor chips arranged at the second distance from one another there is located a radiation-opaque second filling for optical isolation of these semiconductor chips.

These fillings allow purposeful optical coupling or purposeful optical isolation to be achieved between specific semiconductor chips. In this way, a particularly space-saving, dense arrangement of the semiconductor chips can be achieved.

In light-emitting diode modules comprising a plurality of semiconductor chips arranged closely adjacent one another, the problem may arise that light exiting laterally from a semiconductor chip leaves the module at the location of another semiconductor chip or induces adjacent layers of conversion medium to luminesce. This may lead to optical coupling of adjacent semiconductor chips or adjacent groups of semiconductor chips which is undesired in particular for adaptive motor vehicle headlights, especially if these semiconductor chips or groups can be driven electrically mutually independently. On the other hand, it is often also desired for smaller subgroups of semiconductor chips to be driven jointly and to achieve maximally homogeneous emission over these semiconductor chips.

One possible way of achieving such optical coupling and optical isolation consists of inserting mechanical apertures downstream of the semiconductor chips in the emission direction. However, this generally results in comparatively large mechanical structures and in a loss of emitted radiation through the apertures. Furthermore, optical isolation or optical coupling may be achieved by complex optical systems. However, this generally results in significant additional costs.

Furthermore, it is possible to use individual light-emitting diode chips, which each include their own frame for optical isolation. With such light-emitting diode chips, however, a comparatively large minimum distance is required between adjacent, light-emitting regions of these light-emitting diode chips and it is possible only with difficulty to build up a particularly compact, adaptive motor vehicle headlight. Also, when such light-emitting diode chips are used, homogeneous emission can as a rule only be achieved by a complex optical system.

All of the semiconductor chips configured to generate the primary radiation may be identical within the bounds of manufacturing tolerances. For example, just one type of semiconductor chip is used, these nominally emitting in the same spectral range and at the same peak wavelength. The presence of further semiconductor chips is here not necessarily ruled out, for example, diodes for protection against damage from electrostatic discharges or sensors.

The light-emitting diode module may comprise one or more conversion medium bodies. The at least one conversion medium body is configured for partial or complete conversion of the primary radiation into in particular longer-wave secondary radiation. It is possible that precisely one conversion medium body is assigned to each of the semiconductor chips. Furthermore, it is possible for conversion medium bodies to be assigned to different semiconductor chips to generate different secondary radiation. In this way, semiconductor chips or groups of semiconductor chips may be configured to generate mutually different radiation spectra.

The conversion medium bodies or the at least one conversion medium body may be joined to the semiconductor chip or the semiconductor chips by at least one adhesive. The adhesive preferably comprises a silicone-based adhesive. The adhesive may in other words be a silicone. The adhesive is preferably transparent and transmissive for the primary radiation.

The adhesive or a material of the adhesive may partially or completely form the radiation-transmissive first filling. In particular, the adhesive and the first filling are in one piece. The adhesive, together with the first filling, may then extend continuously over a plurality of adjacent semiconductor chips.

The semiconductor chips may be arranged in a common plane. This common plane is preferably oriented parallel to the carrier top. In other words, there is a plane, in particular parallel to the carrier top, which intersects all of the semiconductor chips. Main radiation sides of the semiconductor chips are in this respect preferably oriented parallel to the plane. This may mean in particular that growth directions of epitaxially produced semiconductor layer sequences of the semiconductor chips are in each case oriented perpendicular to this common plane.

The semiconductor chips may be arranged in one or a plurality of rows. The rows comprise, for example, precisely two, precisely three, precisely four, precisely five or more than five semiconductor chips. Within one row the semiconductor chips may be arranged in a straight line. Furthermore, the semiconductor chips within one row are preferably at a constant distance from one another. Within one of the rows, adjacent semiconductor chips may in particular each be at the first distance from one another.

The light-emitting diode module may comprise a plurality of rows. For example, the light-emitting diode module comprises precisely two or precisely three or more than three of the rows. It is possible for adjacent rows to be arranged at the second distance from one another.

The radiation-transmissive first filling may be located in each case between adjacent semiconductor chips within one row. It is thus possible for respectively adjacent semiconductor chips to be optically coupled together within one row. In this way, particularly uniform emission of light may be achieved over one row. Uniform emission may mean that an interval, in particular Full Distance at Half Maximum, FDHM for short, amounts to at most 50% or at most 25% of the interval between adjacent luminance maxima, when viewed in a section perpendicular to the carrier top.

The second filling may be located in each case between at least two adjacent rows or between all the adjacent rows. In other words it is possible for at least some adjacent rows to be optically isolated from one another. It is thus possible for, for example, two adjacent rows to be optically isolated from one another, but for two other adjacent rows to be coupled optically together by the first filling. The rows coupled optically together may be arranged at the first distance from one another.

Precisely one one-piece conversion medium body in each case may be assigned to at least one of the rows or all of the rows. The conversion medium body assigned to one row preferably extends over all the semiconductor chips of this row. Furthermore, this conversion medium body preferably does not extend over semiconductor chips which do not belong to this row. The conversion medium body then preferably covers the regions between the adjacent semiconductor chips within this row, when viewed in plan view.

One or more trenches may be formed in the carrier. The at least one trench extends between at least two of the adjacent semiconductor chips.

The trench may be formed at least or only between those adjacent semiconductor chips arranged at the greater, second distance from one another. It is likewise possible for the trench to be located also or only between the adjacent semiconductor chips arranged at the first distance from one another. The trench may in each case also extend to a region not located between the adjacent semiconductor chips, when viewed in plan view onto the carrier top.

The at least one trench may extend beyond an inner region when viewed in plan view onto the carrier top. The inner region is that region located between the adjacent semiconductor chips when viewed in plan view. The region of the trench extending beyond the inner region is designated the outer region. In the outer region the trench is branched, for example, in the manner of a fan or a mesh. Alternatively or in addition, it is possible for the trench to have a smaller average width in the outer region than in the inner region.

The volume of the trench in the outer region may be at least as great as 5% or 20% or 50% or 100% of the volume of the adhesive located over the main radiation side of the semiconductor chip adjoining said trench. In other words, the volume in the outer region of the trench is preferably of the same order of magnitude as the adhesive volume on one of the semiconductor chips. Alternatively or in addition, the volume of the trench in the outer region amounts to at most 500% or at most 150% or at most 100% or at most 70% of the volume of the adhesive over the adjoining semiconductor chip.

The trench in the outer region, when viewed in plan view onto the carrier top, may have a rim length which corresponds to at least one edge length of the semiconductor chip or to at least twice, five times, ten times or thirty times the edge length. In other words, the rim length of the trench is large compared with the edge length of the semiconductor chip. Since a meniscus forms along the rim of the trench, a considerable proportion of the proportion of the adhesive taken up by the trench is traced back to the rim length of the trench.

All the trenches adjoining the semiconductor chip taken together, or just the outer regions of these trenches, may have a total volume at least as great as the total volume of adhesive applied to the semiconductor chip minus the adhesive volume which remains between the main radiation side and the conversion medium body. The at least one trench is thus then configured to take up the entire quantity of adhesive running down from the main radiation side on pressing on of the conversion medium body.

All the trenches adjoining the semiconductor chip taken together may have a total volume at least as great as a volume equal to the product of an edge length of the semiconductor chip, the first or second distance, a thickness of the semiconductor chip in the direction perpendicular to the carrier top and a factor. The factor amounts to 0.5 or 0.65 or 0.75.

A capillary action of the trench for the material of the adhesive may be greater than a capillary action of the adjacent semiconductor chips between which the trench is formed. The capillary action of the trench exceeds the capillary action of the space between the adjacent semiconductor chips by, for example, at least a factor of 1.5 or by at least a factor of 2. In other words, the trench is formed such that, in terms of width and material and surface geometry, adhesive material running down from the main radiation side of the adjacent semiconductor chip does not remain between the adjacent semiconductor chips but rather is drawn into the trench due to the greater capillary action.

A distance between the adjacent semiconductor chips between which the at least one trench is located may be less than a maximum or than an average width of the associated trench. A greater capillary action of the trench is then achieved in particular by the surface geometry and surface material of the trench.

The light-emitting diode module may comprise one or more insert plates. The at least one insert plate is preferably radiation-opaque for the primary radiation and/or for the secondary radiation.

The insert plate may partially or completely constitute the second filling. In other words, the insert plate is then located at least in part between adjacent semiconductor chips. The insert plate may then when viewed in plan view onto the carrier top, extend into the inner region, for example, between adjacent rows.

The insert plate, at least in the inner region, may have a thickness of at most 200 µm or of at most 150 µm. The insert plate preferably does not extend beyond the conversion medium body or the adhesive or the main radiation side, in the direction away from the carrier top. The insert plate is preferably made from or consists of a ceramic material or a plastics material.

The first distance may be at least 20 µm or at least 40 µm or at least 60 µm. Alternatively or in addition, the first distance is at most 250 µm or at most 200 µm or at most 150 µm. Furthermore, the second distance may alternatively or in addition be at least 200 µm or at least 250 µm and/or at most 400 µm or at most 300 µm.

The first filling may extend beyond a main radiation side of the semiconductor chip in the direction away from the carrier top. Moreover, the first filling may extend beyond a top of the adhesive remote from the carrier top. The filling preferably does not extend beyond the conversion medium body.

An inner region between adjacent semiconductor chips arranged at the second distance from one another may be filled in part with a material of the first filling. In this inner region, in the direction away from the carrier top, the second filling preferably follows the first filling. In this inner region, the first and second fillings may be in direct contact with one another.

The semiconductor chips may be mounted, for example, soldered on at least one metallized area of the carrier on the carrier top. The thickness of the metallized area is, for example, at least 5 µm or at least 10 µm and/or at most 75 µm or at most 50 µm.

The metallized area may have lateral boundary faces. At least one lateral boundary face of the metallized area, which may be oriented approximately perpendicularly to the carrier top, is preferably sharp-edged and may be roughened. The angle between the lateral boundary faces and a top of the metallized area remote from the carrier top is preferably an acute angle. Sharp-edged may mean that the lateral boundary faces, when viewed in cross-section, are provided with peaks and points.

The second filling may extend beyond the semiconductor chips and/or the adhesive and/or the conversion medium body, in a direction away from the carrier top. The top of the second filling remote from the carrier top may be planar, concave or indeed convex in shape. The conversion medium body is preferably not covered by the second filling, when viewed in plan view, just as it is not by the first filling.

The second filling may comprise a matrix material. The matrix material is preferably transparent and radiation-transmissive. The matrix material may be a silicone or a silicone/epoxy hybrid material. Particles are preferably embedded in this matrix material. The particles may have a reflective and/or absorbing action with regard to the primary radiation and/or the secondary radiation. For example, the particles may be soot particles, titanium dioxide particles or metal flakes. Preferably, no electrical connection is produced between the adjacent semiconductor chips by the second filling.

The semiconductor chips or individual groups of semiconductor chips may be driven and operated electrically mutually independently. In particular, those semiconductor chips electronically connect together into a group which are coupled together optically. For example, the semiconductor chips within one row electronically connect in series. Likewise, the nth semiconductor chip of a row may, for example, electrically connect in parallel or in series with the nth semiconductor chip of another row and form a group. Here, n is a count index in the respective rows in a given direction.

Furthermore, we provide a motor vehicle headlight having one or more light-emitting diode modules, as described in relation to one or more of the above-stated examples. Features of the light-emitting diode module are therefore also disclosed for the motor vehicle headlight and vice versa.

A preferably aperture-free optical system may be arranged downstream of the light-emitting diode module of the motor vehicle headlight.

A light-emitting diode module described here will be explained in greater detail below with reference to the drawings and with the aid of examples. Elements which are the same in the individual figures are indicated with the same reference numerals. The relationships between the elements are not shown to scale, however, but rather individual elements may be shown exaggeratedly large to assist in understanding.

FIG. 1 is a schematic plan view of an example of a light-emitting diode module 1. The light-emitting diode module 1 comprises a carrier 2 with a carrier top 20. A plurality of optoelectronic semiconductor chips 3 are mounted in two straight rows next to one another on the carrier top 20, the semiconductor chips being light-emitting diodes. The semiconductor chips 3 within one of the rows are each arranged at a first distance D1 from one another. The rows of semiconductor chips 3 are spaced by a second distance D2. The second distance D2 is greater than the first distance D1.

Along the rows a first filling 41, indicated in FIG. 1 by hatching, is located between each pair of adjacent semiconductor chips 3. The first filling 41 is radiation-transmissive and configured for optical coupling of the adjacent semiconductor chips 3, between which the first filling 41 is located.

Between the rows and around the arrangement of semiconductor chips 3 there is located a second filling 42. The second filling 42 is radiation-opaque and configured for optical isolation of the two rows from one another. For example, the second filling is reflective and appears white to an observer.

A frame may optionally be located around the second filling 42, but this is not shown in FIG. 1. Electrical conductor tracks of the carrier 2 are not shown in FIG. 1 to simplify representation. The carrier top 20 is preferably planar, at least in a region in which the arrangement of the semiconductor chips 3 is mounted. Unlike in the illustration, it is also possible for more than two rows to be mounted on the carrier 2 or indeed just one, within which two optically isolated subsections are arranged at the second distance D2 from one another while the first distance D1 and optical coupling prevail within the subsections.

In the FIGS. 2 to 14 the fillings 41, 42 are not shown or are shown only in part to simplify representation. However, these fillings 41, 42 are also present in the examples according to FIGS. 2 to 14.

Figure 2:
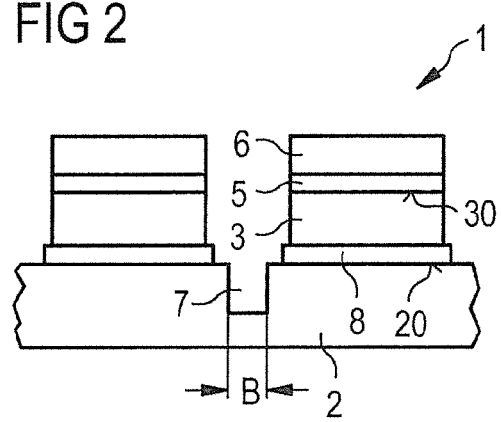

In the example according to the sectional representation in FIG. 2, the semiconductor chips 3 are each mounted on a metallized area 8 on the carrier top 20. On a main radiation side 30 of the semiconductor chip 3 remote from the carrier 2 there is in each case located a conversion medium body 6. The conversion medium body 6 is mounted on the main radiation side 30 by an adhesive 5. Some of the radiation generated in the semiconductor chips 3 during operation is converted into radiation of a different wavelength by way of the conversion medium body 6.

The conversion medium body 6 preferably comprises a premanufactured body produced separately from the semiconductor chips 3. In particular, the conversion medium body 6 is mechanically self-supporting and can be handled using a pick-and-place machine. The conversion medium body 6 is preferably applied to the semiconductor chips 3 as a solid. On application of the conversion medium body 6 the adhesive 5 has a liquid consistency. After application of the conversion medium body 6 the adhesive 5 is cured.

FIG. 2 shows that a trench 7 is formed in the carrier 2 between the adjacent semiconductor chips 3. The width B of the trench 7 is less than the distance between the semiconductor chips 3. This distance between the semiconductor chips 3 according to FIG. 2 may be the first distance or indeed the second distance. The metallised area 8 does not extend as far as to the trench 7.

The width B of the trench 7 is preferably less than the depth of the trench 7. For example, the width B at the carrier top 20 is at least 30 µm or at least 50 µm or at least 80 µm. Alternatively or in addition, the width B is at most 200 µm or at most 150 µm or at most 120 µm. Unlike in the illustration, the trench 7 may also be V-shaped or U-shaped and not rectangular, when viewed in cross-section. For example, the trench 7 may be produced by etching, by scribing or by laser ablation. The properties stated in relation to FIG. 2 for the trench 7 may also apply to all the other examples.

Figure 3:
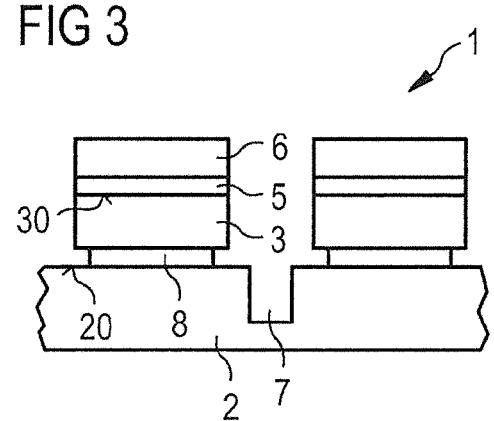

FIG. 3 shows that the metallized area 8 does not extend laterally beyond the semiconductor chip 3, unlike in FIG. 2. In the example according to FIG. 3 too, the trench 7 is narrower than the distance between the semiconductor chips 3.

Figure 4:
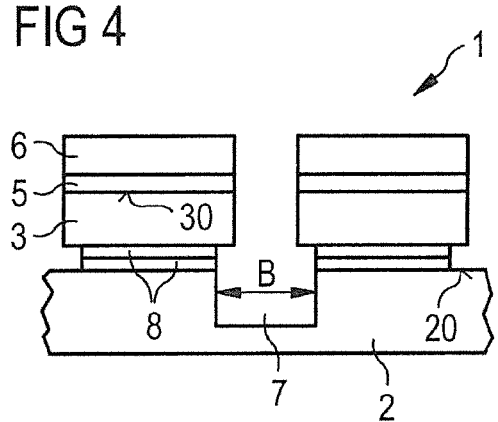

According to FIG. 4, the width B of the trench 7 is greater than the distance between the semiconductor chips 3. The metallized area 8, which may also be of multilayer construction, extends up to the trench 7.

Figure 5:
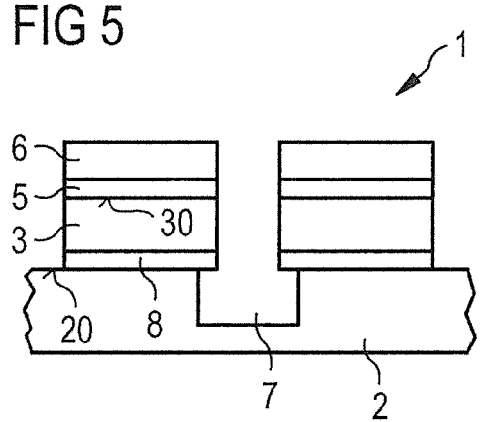

According to FIG. 5, both the metallized area 8 and the semiconductor chip 3 partly cover the trench 7. The metallized area 8 may terminate flush with the semiconductor chip 3, in a direction parallel to the carrier top 20.

The trench 7 is configured to take up excess adhesive material 5 running down from the main radiation side 30 as a result of relatively strong capillary action on mounting of the conversion medium body 6. This makes it possible to prevent excess adhesive material from accumulating in excessive amounts between the semiconductor chips 3 in particular in an intermediate region between the semiconductor chips 3 defined by the second distance D2. It is possible for excess adhesive material to pass completely or virtually completely through capillary action into the trench 7.

Figure 6:
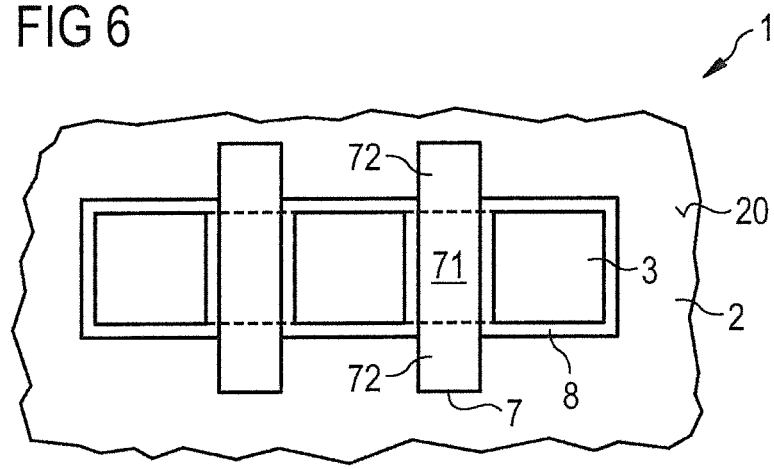

FIG. 6 shows a plan view of the light-emitting diode module 1. When viewed in plan view, the trenches 7 extend beyond an inner region 71 which is located between the semiconductor chips 3. In other words, the trenches 7 each have two outer regions 72 in addition to the inner region 71, when viewed in plan view. The volume of the trench 7, in each of the outer regions 72 or in the two outer regions 72 of a trench 7 together, is preferably of the same order of magnitude as the volume of the adhesive 5 over the main radiation side of the adjoining semiconductor chip 3.

Figure 7:
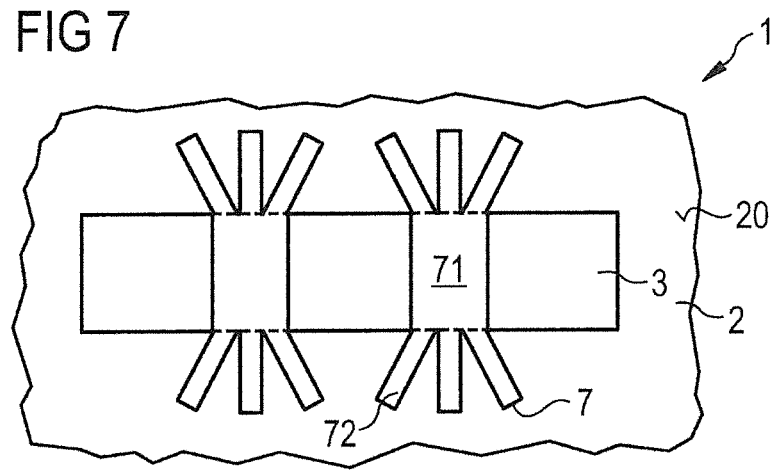

According to FIG. 7, the outer regions 72 are formed of a plurality of partial trenches extending away from the inner region 71 in the form of a fan. These partial trenches in the outer region 72 have a smaller average width and thus an increased capillary action, in particular for a material of the adhesive.

Figure 8:
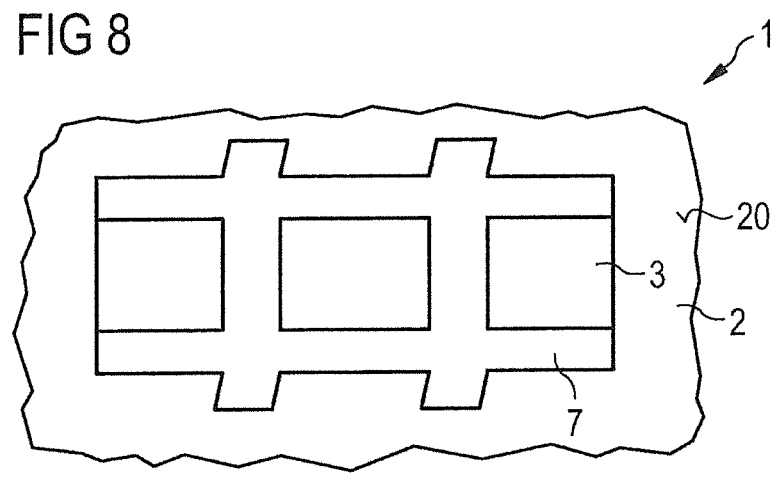

In the example according to FIG. 8, the trench is grid-like, mesh-like or frame-like. Unlike the illustration in FIG. 8, it is possible for the trench 7 to extend beyond the semiconductor chips 3 also in the longitudinal direction of the row of semiconductor chips 3. Perpendicular to the longitudinal direction of the row the trench 7 is configured similarly to the configuration shown in FIG. 6.

In the example according to FIG. 9, see the schematic sectional representation in FIG. 9A, the partial view in FIG. 9B and the plan view in FIG. 9C, the metallised area 8 has a lateral boundary face 80. The lateral boundary face 80 is oriented approximately perpendicular to the carrier top 20.

The lateral boundary face 80 is roughened, with sharp-edged peaks. This increases capillary action and wettability at the boundary face 80, in terms of the material of the adhesive 5. An angle between a top of the metallized area 8, which is remote from the carrier top 20, and the boundary face 80 is an acute angle, see FIG. 9B.

The metallized area 8 may extend further beyond the semiconductor chips 3 in a direction perpendicular to a longitudinal direction of the row than in the longitudinal direction of the row, see FIG. 9C. In FIG. 9C the longitudinal direction of the row of semiconductor chips 3 extends from left to right. The thickness of the metallized area 8 is, for example, in the range of several tens of micrometers.

Optionally, in addition to the roughened boundary face 80, in the example according to FIG. 9 a trench 7 is also mounted. The side walls of the trench 7 may also be roughened. If the trench 7 is absent, the area of the boundary face 80 is preferably of a size to accommodate excess material of the adhesive 5 to a sufficient degree.

Figure 10:
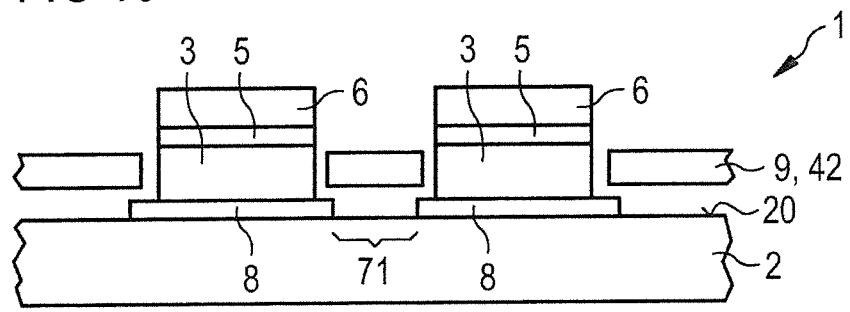

According to FIG. 10, the light-emitting diode module 1 comprises an insert plate 9. The insert plate 9 extends into the inner region 71 between the semiconductor chips 3. According to FIG. 10, the thickness of the insert plate 9 is less than the thickness of the semiconductor chip 3, perpendicular to the carrier top 20.

The insert plate 9 constitutes a part of the second, radiation-opaque filling 42. For example, the insert plate 9 is made from a white, reflective ceramic. Unlike in the illustration, it is possible for the insert plate 9 to be in contact with the metallised areas 8 and to rest on the metallized areas 8. A further component of the second filling 42, in which the insert plate 9 is preferably embedded, is not shown in FIG. 10.

A distance in a direction parallel to the carrier top 20 between the insert plate 9 and the semiconductor chips 3 is preferably in each case in the range of a few micrometers, for example, at least 1 µm or at least 2 µm or at least 5 µm and/or preferably at most 50 µm or at most 30 µm or at most 15 µm.

Figure 11:
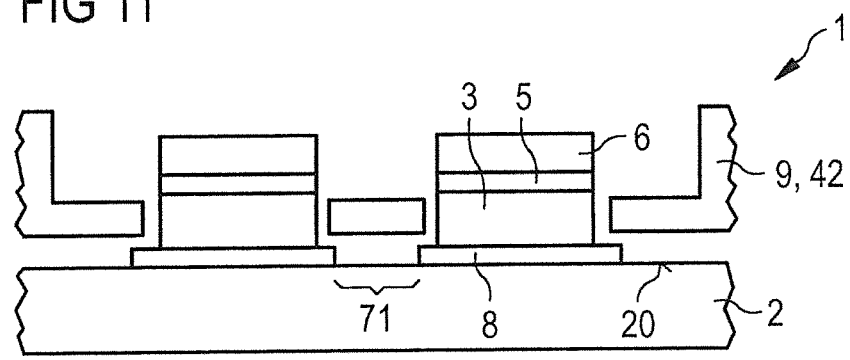

FIG. 11 shows that the insert plate 9, outside the arrangement of the semiconductor chips 3 and outside the inner region 71, has a raised peripheral rim. This peripheral rim may extend beyond the conversion medium body 6, in the direction away from the carrier top 20. In the direction away from the carrier top 20 the insert plate 9 extends in particular in the inner region 71 up to the level of the adhesive 4.

Figure 12:
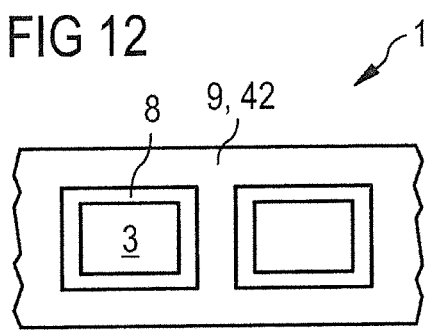
Figure 13:
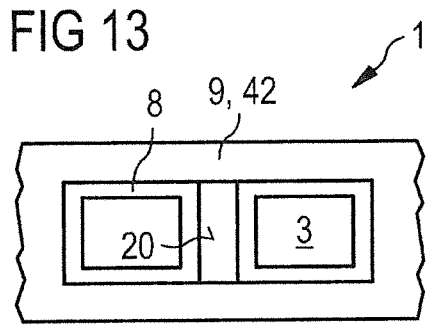

In the schematic plan view according to FIG. 12, the insert plate 9 in each case surrounds each of the semiconductor chips 3. In the example according to FIG. 13, the insert plate 9 forms a frame completely around the semiconductor chip 3 or, other than shown in the drawing, in each case around a row of the semiconductor chips 3.

Preferably no insert plate is located in an inner region 71 between adjacent semiconductor chips, which are optically coupled and are arranged at the smaller, first distance D1 from one another.

In the plan view of the example of the light-emitting diode module 1 according to FIG. 14, the semiconductor chips 3 are arranged in two rows. The semiconductor chips 3 of one row are each covered jointly by a one-piece conversion medium body 6.

In FIGS. 15 to 18 the fillings 41, 42 are shown in each case in greater detail in sectional representations. Fillings as shown in conjunction with these Figures may find corresponding application in all the other examples.

FIG. 15 shows the first filling 41 between the semiconductor chips 3 arranged at the distance D1. The first filling 41 is formed in one piece with the adhesive 5 and made from the same material. In the direction away from the carrier top 20, the first filling 41 extends up to the level of the conversion medium bodies 6. The first filling 41 is shaped concavely in the inner region 71.

In FIG. 16 the inner region 71 between semiconductor chips 3 arranged at the greater distance D2 is filled in part with the first filling 41. A minimum height of the first filling 41 reaches, in the direction away from the carrier top 20, preferably at most to half the height of the semiconductor chips 3. The first filling 41 is followed directly by the concavely shaped second filling 42.

According to FIG. 17, the second filling 42 is multicomponent in form. For example, the first component 42*a* is reflective and the second component 42*b* is absorbing, in particular black. According to FIG. 17, the second filling is convex and extends beyond a side of the conversion medium bodies 6 remote from the carrier top 20.

In the example according to FIG. 18, the second filling 42 is concave in the inner region 71. Unlike in FIG. 18, the second filling 42 may also have a flat top, which is then oriented substantially parallel to the carrier top 20, or a convex top. This may also be the case in each case for the first filling.

Figure 19:
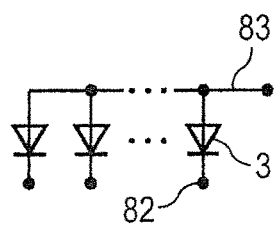
FIGS. 19A-F show schematic representations of electrical interconnections of our semiconductor chips for our light-emitting diode modules.
Figure 19:
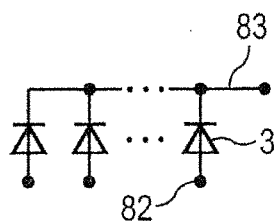
Figure 19:
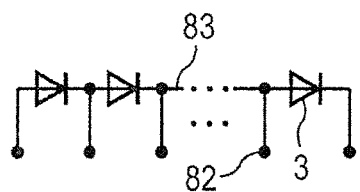
Figure 19:
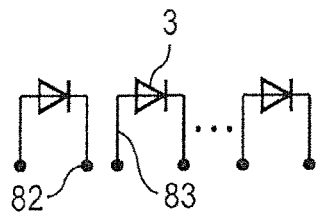
Figure 19:
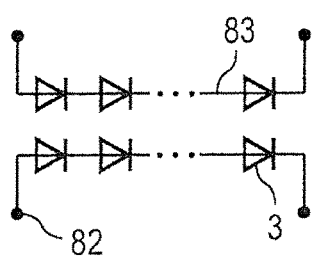
Figure 19:
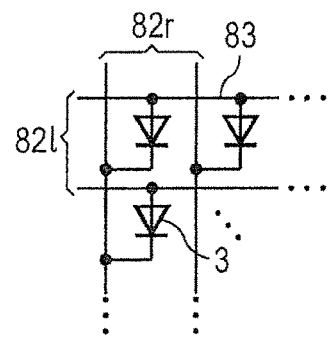

FIG. 19 shows various interconnection options for the semiconductor chips 3 for the examples of the light-emitting diode module 1. The semiconductor chips 3 and contact points 82 and electrical conductor tracks 83 are in each case illustrated only schematically. According to FIGS. 19A to 19D and 19F, the semiconductor chips 3 are each individually electrically drivable. According to FIG. 19E, the semiconductor chips 3 within one row connect electrically in series. FIG. 19F shows a matrix circuit, the contact points 82*r* in columns and the contact points 82*l* in rows being shown only in a greatly simplified manner.

Figure 20:
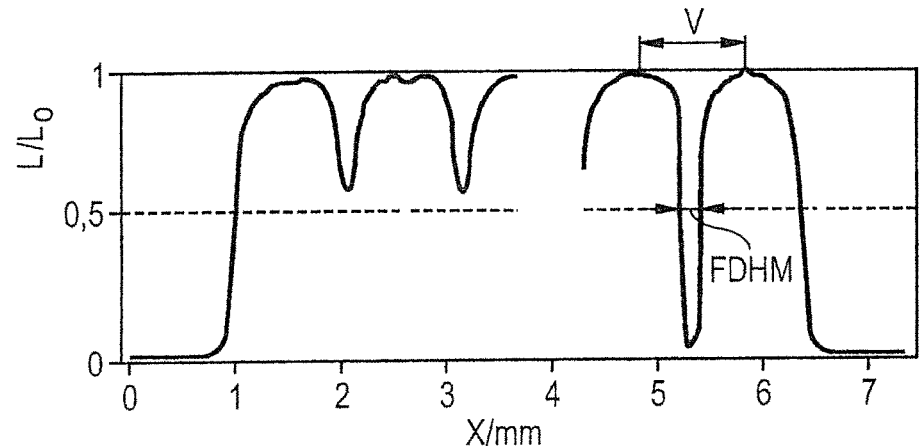

FIG. 20 shows a luminance L, normalized to a maximum luminance $L_O$, from two examples of the light-emitting diode module 120, in the direction x along a row of semiconductor chips 3 and perpendicular to the carrier top 20. The emission pattern over the row is here uniform, as preferably also in all the other examples. Uniform means, for example, that an FDHM interval of the luminance L between two adjacent semiconductor chips 3 does not exceed twice the interval V or a quarter of the interval V or an eighth of the interval V between adjacent luminance maxima. Likewise, the FDHM interval may also be equal to zero, as shown in the left-hand half of FIG. 20. It is possible for the minimum luminance L between two adjacent luminance maxima to amount to at least 20% or at least 40% or at least 50% or at least 60% of the luminance L in the maxima.

Our methods and headlights described here are not restricted by the description given with reference to the examples. Rather, this disclosure encompasses any novel feature and any combination of features, including in particular any combination of features in the appended claims, even if the feature or combination is not itself explicitly indicated in the claims or examples.

The invention claimed is:

1. A light-emitting diode module comprising:
a carrier with a carrier top,
a plurality of optoelectronic semiconductor chips mounted on the carrier top and configured to generate primary radiation,
a radiation-transmissive first filling, and
a radiation-opaque second filling,
wherein
the semiconductor chips display in part a first distance and in part a second, larger distance from one another,
the first filling is located between the adjacent semiconductor chips arranged at the first distance from one another for optical coupling of the adjacent semiconductor chips with one another,
the second filling is located between the adjacent semiconductor chips arranged at the second distance from one another for optical isolation of the adjacent semiconductor chips from one another,
at least one trench is formed in the carrier, and
the trench is formed at least or only between adjacent semiconductor chips arranged at the greater, second distance from one another.

2. The light-emitting diode module according to claim 1, further comprising:
at least one conversion medium body for at least partial conversion of the primary radiation into secondary radiation, and
at least one adhesive with which the conversion medium body is mounted on at least one of the semiconductor chips,
wherein
the adhesive forms the radiation-transmissive first filling,
the semiconductor chips are arranged in a common plane,
the semiconductor chips are arranged in at least or precisely two rows with in each case at least three of the semiconductor chips,
the first filling is located between the semiconductor chips within one row, and
the second filling is located between at least two adjacent rows.

3. The light-emitting diode module according to claim 2, wherein precisely one one-piece conversion medium body is assigned to at least one of the rows, the conversion medium body extending over all the semiconductor chips of just this row.

4. The light-emitting diode module according to claim 1, wherein the at least one trench when viewed in plan view onto the carrier top extends beyond an inner region between the adjacent semiconductor chip and the trench is branched in the shape of a fan in an outer region extending beyond the inner region.

5. The light-emitting diode module according to claim 4, wherein volume of the at least one trench in the outer region amounts to at least 20% of the volume of the adhesive located on one of the adjacent semiconductor chips.

6. The light-emitting diode module according to claim 1, wherein capillary action of the trench for a material of the adhesive is greater than capillary action of the adjacent semiconductor chips between which the trench is formed.

7. The light-emitting diode module according to claim 1, wherein a distance between the adjacent semiconductor chips, between which the at least one trench is formed, is smaller than a width of the trench.

8. The light-emitting diode module according to claim 1, further comprising at least one insert plate which is radiation-opaque and forms at least one part of the second filling.

9. The light-emitting diode module according to claim 2, further comprising at least one insert plate which is radiation-opaque and forms at least one part of the second filling, wherein
the insert plate, at least in the inner region between the semiconductor chips, has a thickness of at most 200 μm and does not extend beyond the conversion medium body, in a direction away from the carrier top, and
the insert plate is made from a ceramic material or from a plastics material.

10. The light-emitting diode module according to claim 1, wherein the first distance is 20 μm to 200 μm and the second distance is 200 μm to 400 μm, the first filling extends beyond a main radiation side of the semiconductor chips, in a direction away from the carrier top, and the inner region between adjacent semiconductor chips arranged at the second distance from one another is only partially filled with the material of the first filling and the second filling follows the first filling in this inner region in the direction away from the carrier top.

11. The light-emitting diode module according to claim 1, wherein the semiconductor chips are mounted on at least one metallized area on the carrier top, and thickness of the metallized area is 5 μm to 75 μm and a lateral boundary face of the metallized area is roughened and sharp-edged.

12. The light-emitting diode module according to claim 1, wherein the second filling extends beyond the semiconductor chips in a direction away from the carrier top, and the second filling comprises as a matrix material a transparent, radiation-transmissive silicone or silicone/epoxy hybrid material and reflective and/or absorbing particles embedded in the matrix material.

13. The light-emitting diode module according to claim 1, wherein the semiconductor chips or individual groups of semiconductor chips can be electrically driven independently of one another, and the semiconductor chips are optically coupled together within one group.

* * * * *